United States Patent
Yun et al.

(10) Patent No.: US 9,082,612 B2
(45) Date of Patent: Jul. 14, 2015

(54) COMPOSITION FOR FORMING A SILICA LAYER, METHOD OF MANUFACTURING THE COMPOSITION, SILICA LAYER PREPARED USING THE COMPOSITION, AND METHOD OF MANUFACTURING THE SILICA LAYER

(75) Inventors: Hui-Chan Yun, Uiwang-si (KR);
Taek-Soo Kwak, Uiwang-si (KR);
Bong-Hwan Kim, Uiwang-si (KR);
Jin-Hee Bae, Uiwang-si (KR);
Jung-Kang Oh, Uiwang-si (KR);
Sang-Hak Lim, Uiwang-si (KR);
Dong-Il Han, Uiwang-si (KR);
Sang-Kyun Kim, Uiwang-si (KR);
Jin-Wook Lee, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 639 days.

(21) Appl. No.: 13/330,856

(22) Filed: Dec. 20, 2011

(65) Prior Publication Data
US 2012/0164382 A1    Jun. 28, 2012

(30) Foreign Application Priority Data

Dec. 22, 2010  (KR) .................. 10-2010-0132734
Oct. 20, 2011   (KR) .................. 10-2011-0107657

(51) Int. Cl.
*H01L 21/02* (2006.01)
*C09D 183/02* (2006.01)
(Continued)

(52) U.S. Cl.
CPC ........... *H01L 21/02282* (2013.01); *C08L 83/16* (2013.01); *C09D 183/02* (2013.01); *H01L 21/02164* (2013.01); *H01L 21/02222* (2013.01); *B05D 5/00* (2013.01); *B05D 5/12* (2013.01); *B32B 9/00* (2013.01); *C09D 183/00* (2013.01); *C09D 183/08* (2013.01); *Y10T 428/24355* (2015.01)

(58) Field of Classification Search
None
See application file for complete search history.

(56) References Cited

U.S. PATENT DOCUMENTS 4,482,669 A *  11/1984  Seyferth et al. ............... 524/442
4,869,858 A    9/1989   Funayama et al.
(Continued)

FOREIGN PATENT DOCUMENTS

CN    1193412 C    3/2005
CN    1757105 A    4/2006
(Continued)

OTHER PUBLICATIONS

Search Report dated Dec. 23, 2013 in corresponding Chinese Patent Application No. 201110430768.9.
(Continued)

*Primary Examiner* — Robert S Loewe
(74) *Attorney, Agent, or Firm* — Lee & Morse, P.C.

(57) ABSTRACT

A composition for forming a silica layer, a method of manufacturing the composition, a silica layer prepared using the composition, and a method of manufacturing the silica layer, the composition including hydrogenated polysilazane, hydrogenated polysiloxazane, or a combination thereof, wherein a concentration of a sum of hydrogenated polysilazane and hydrogenated polysiloxazane having a weight average molecular weight, reduced to polystyrene, of greater than or equal to about 50,000 is about 0.1 wt % or less, based on a total amount of the hydrogenated polysilazane and hydrogenated polysiloxazane.

13 Claims, 1 Drawing Sheet

(51) Int. Cl.
  *C08L 83/16* (2006.01)
  *B32B 9/00* (2006.01)
  *C09D 183/00* (2006.01)
  *B05D 5/12* (2006.01)
  *B05D 5/00* (2006.01)
  *C09D 183/08* (2006.01)

(56) References Cited

U.S. PATENT DOCUMENTS

| | | | | |
|---|---|---|---|---|
| 4,965,058 | A | * | 10/1990 | Funayama et al. ............ 423/325 |
| 4,975,512 | A | * | 12/1990 | Funayama et al. ............... 528/28 |
| 5,008,422 | A | * | 4/1991 | Blum et al. .................... 556/412 |
| 5,055,431 | A | * | 10/1991 | Blum et al. .................. 501/96.2 |
| 6,562,465 | B1 | * | 5/2003 | Nakashima et al. ........... 428/412 |
| 6,652,978 | B2 | | 11/2003 | Lukacs, III et al. |
| 6,767,641 | B1 | * | 7/2004 | Shimizu et al. ............... 428/446 |
| 7,344,603 | B2 | * | 3/2008 | Shimizu et al. .................. 134/34 |
| 7,879,397 | B2 | | 2/2011 | Watanabe et al. |
| 8,058,711 | B2 | | 11/2011 | Lim et al. |
| 2006/0160321 | A1 | * | 7/2006 | Ichiyama et al. ............. 438/424 |
| 2009/0012221 | A1 | * | 1/2009 | Hong et al. ................... 524/378 |
| 2009/0140235 | A1 | * | 6/2009 | Kamata et al. .................. 257/40 |
| 2009/0305063 | A1 | * | 12/2009 | Hayashi ........................ 428/447 |
| 2011/0129981 | A1 | * | 6/2011 | Lim et al. ...................... 438/381 |

FOREIGN PATENT DOCUMENTS

| | | |
|---|---|---|
| EP | 0-304-239 A1 | 2/1989 |
| JP | 10-046108 A | 2/1998 |
| JP | 10-194826 A | 7/1998 |
| JP | 11-302595 A | 11/1999 |
| JP | 3208040 B2 | 9/2001 |
| JP | 2001-308090 A | 11/2001 |
| JP | 3479648 B2 | 12/2003 |
| JP | 3516815 B2 | 4/2004 |
| JP | 2008-140896 A | 6/2008 |
| KR | 10-2009-0060433 A | 6/2009 |
| KR | 10-2011-0062158 A | 6/2011 |
| KR | 10-20141-0062158 A | 6/2011 |

OTHER PUBLICATIONS

Taiwanese Search Report in TW 100147708, dated Dec. 4, 2013 (Yun, et al.).

* cited by examiner

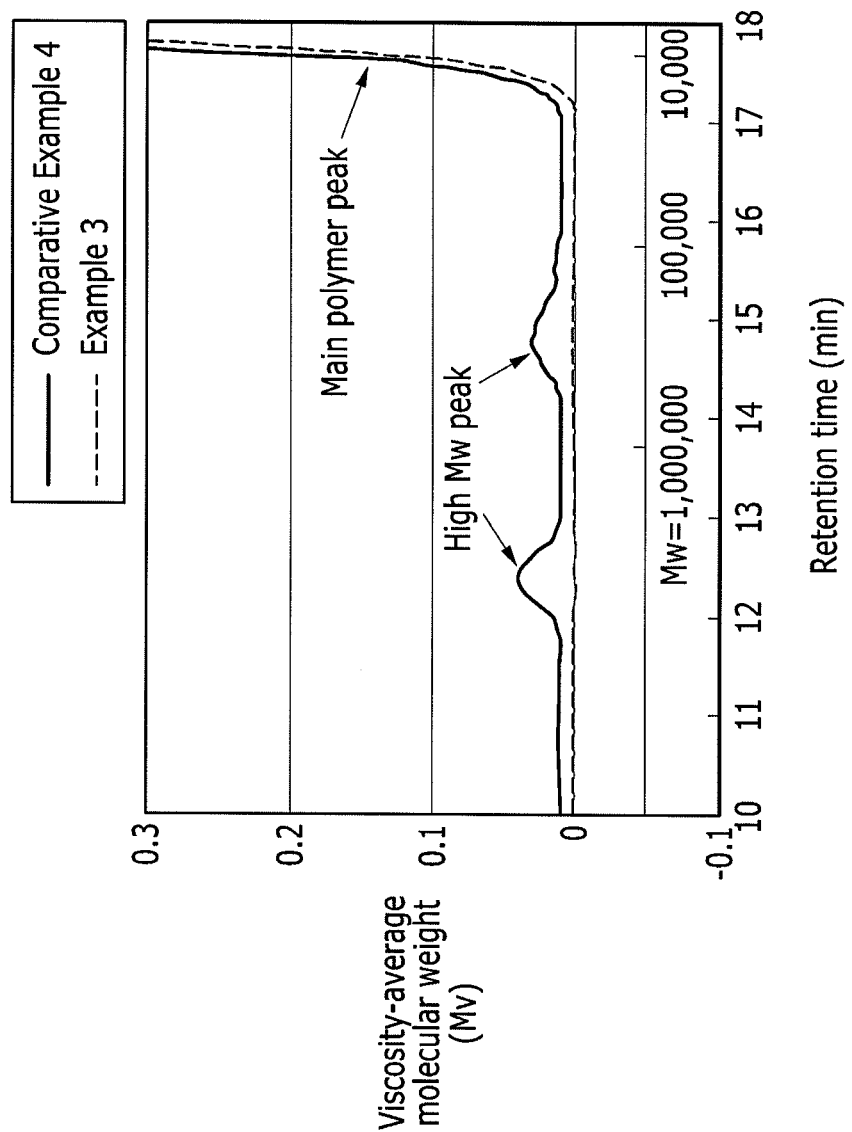

COMPOSITION FOR FORMING A SILICA LAYER, METHOD OF MANUFACTURING THE COMPOSITION, SILICA LAYER PREPARED USING THE COMPOSITION, AND METHOD OF MANUFACTURING THE SILICA LAYER

BACKGROUND

1. Field

Embodiments relate to a composition for forming a silica layer, a method of manufacturing the composition, a silica layer prepared using the composition, and a method of manufacturing the silica layer.

2. Description of the Related Art

As semiconductor technology is increasingly developed, forming highly-integrated and faster semiconductor memory cells that have improved performance and integrate smaller semi-conductor chips have been considered. Among these semiconductor memory cells, e.g., DRAM (dynamic random access memory), may be used. The DRAM may be capable of freely inputting and outputting information, and may realize large capacity.

The DRAM may include, e.g., a plurality of unit cells including one MOS transistor (MOS transistor) and one capacitor. The capacitor may include two electrodes and a dielectric layer disposed therebetween. The capacitor may have various capacities depending on, e.g., a dielectric constant, a thickness of the dielectric layer, an area of the electrodes, or the like.

SUMMARY

Embodiments are directed to a composition for forming a silica layer, a method of manufacturing the composition, a silica layer prepared using the composition, and a method of manufacturing the silica layer.

The embodiments may be realized by providing a composition for forming a silica layer, the composition including hydrogenated polysilazane, hydrogenated polysiloxazane, or a combination thereof, wherein a concentration of a sum of hydrogenated polysilazane and hydrogenated polysiloxazane having a weight average molecular weight, reduced to polystyrene, of greater than or equal to about 50,000 is about 0.1 wt % or less, based on a total amount of the hydrogenated polysilazane and hydrogenated polysiloxazane.

The concentration of the sum of hydrogenated polysilazane and hydrogenated polysiloxazane having a weight average molecular weight, reduced to polystyrene, of greater than or equal to about 50,000 may be about 0.05 wt % or less, based on the total amount of the hydrogenated polysilazane and hydrogenated polysiloxazane.

The composition for forming a silica layer may have a number of in-liquid particulates of about 100 or less per cc of solution.

The hydrogenated polysilazane or the hydrogenated polysiloxazane may include a moiety represented by the following Chemical Formula 1:

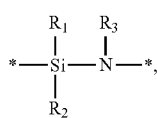

<Chemical Formula 1> and in Chemical Formula 1, $R_1$ to $R_3$ may each independently b hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

The composition may include hydrogenated polysiloxazane that includes a moiety represented by the following Chemical Formula 2:

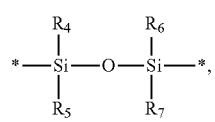

<Chemical Formula 2> and in Chemical Formula 2, $R_4$ to $R_7$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

The hydrogenated polysiloxazane may further include a moiety represented by the following Chemical Formula 3 at a terminal end thereof:

*—SiH$_3$,  <Chemical Formula 3> the hydrogenated polysiloxazane may have an oxygen content of about 0.2 wt % to about 3 wt %, and the moiety represented by Chemical Formula 3 may be present in the hydrogenated polysiloxazane in an amount of about 15 wt % to about 35 wt %, based on a total amount of Si—H bonds in the hydrogenated polysiloxazane.

The hydrogenated polysilazane or the hydrogenated polysiloxazane may have a weight average molecular weight of about 1,000 to about 10,000.

The hydrogenated polysilazane or the hydrogenated polysiloxazane may be present in the composition in an amount of about 0.1 wt % to about 50 wt %, based on a total weight of the composition.

The embodiments may also be realized by providing a method of manufacturing a composition for forming a silica layer comprising a hydrogenated polysilazane or a hydrogenated polysiloxazane, the method including mixing a halosilane compound with a solvent, co-ammonolyzing the halosilane in the solvent to synthesize a hydrogenated polysilazane or a hydrogenated polysiloxazane to form a resultant solution including the hydrogenated polysilazane or the hydrogenated polysiloxazane; precipitating an insoluble precipitate by adding an additional solvent to the resultant solution, the additional solvent including a C4 to C10 alkane, a C4 to C10 cycloalkane, a C4 to C10 alkene, a C4 to C10 cycloalkene, decalin, tetralin, p-cymene, p-menthane, α-pinene, or a combination thereof; and removing the precipitated insoluble precipitate.

A weight ratio of the solvent included in the solution before adding the additional solvent to the additional solvent may be about 1:1 to about 1:30.

The method may further include removing the additional solvent after removing the precipitated insoluble precipitate.

Removing the precipitated insoluble precipitate may include filtering and removing the precipitated insoluble precipitate with a filter having a pore size of about 0.01 to about 0.2 μm.

The embodiments may also be realized by providing a silica layer manufactured by curing the composition for forming a silica layer according to an embodiment, the silica layer including a number of defects having a size of less than or equal to about 5 of about 1,000 or less per 8-inch wafer.

The embodiments may also be realized by providing a method of manufacturing a silica layer having reduced defects, the method including coating the composition for forming a silica layer according to an embodiment on a substrate; drying the substrate coated with the composition for forming a silica layer; and curing the composition in a water vapor-containing atmosphere at a temperature of about 200° C. or higher.

BRIEF DESCRIPTION OF THE DRAWING

The embodiments will become apparent to those of ordinary skill in the art by describing in detail exemplary embodiments with reference to the attached drawing in which:

FIG. 1 illustrates a graph showing Gel Permeation Chromatography data for Example 3 and Comparative Example 4.

DETAILED DESCRIPTION

Korean Patent Application Nos. 10-2010-0132734, filed on Dec. 22, 2010 and 10-2011-0107657 filed on Oct. 20, 2011, in the Korean Intellectual Property Office, and entitled: "Composition for Forming Silica Layer, Method for Manufacturing the Same, Silica Layer Using the Same, and Method for Manufacturing Silica Layer," is incorporated by reference herein in its entirety.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "substituted" may refer to one substituted with at least one a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, an alkyl group, a C2 to C16 alkenyl group, a C2 to C16 alkynyl group, an aryl group, a C7 to C13 arylalkyl group, a C1 to C4 oxyalkyl group, a C1 to C20 heteroalkyl group, a C3 to C20 heteroarylalkyl group, a C3 to C16 cycloalkyl group, a C3 to C15 cycloalkenyl group, a C6 to C15 cycloalkynyl group, a C1 to C16 heterocycloalkyl group, and a combination thereof.

As used herein, when a definition is not otherwise provided, the prefix 'hetero' may refer to one including 1 to 3 heteroatoms selected from N, O, S, and P.

According to an embodiment, a composition for forming a silica layer may include hydrogenated polysilazane, hydrogenated polysiloxazane, or a combination thereof. The composition for forming a silica layer may have high molecular particulates removed therefrom. For example, particles of hydrogenated polysilazane and/or hydrogenated polysiloxazane (having a weight average molecular weight, reduced to polystyrene, of greater than or equal to about 50,000) may be present in the composition at a concentration of less than or equal to about 0.1 wt %, based on a total amount of the hydrogenated polysilazane and/or hydrogenated polysiloxazane.

The hydrogenated polysilazane or hydrogenated polysiloxazane may be converted into a condense silica glass material or silica layer by heating and an oxidizing reaction, and may be used for, e.g., an insulation layer, a separation layer, a hard coating, or the like. When using the composition for forming a silica layer, voids or defects in the layer may be controlled and/or reduced, so the silica layer may be useful for manufacturing a device having high quality electric characteristics, e.g., a semiconductor, a liquid crystal, or the like.

For example, a fluid particulate included in the composition for forming a silica layer may cause voids or defects in the silica layer manufactured using the composition. Accordingly, the composition for forming a silica layer according to an embodiment may be one in which the fluid particulates are removed, and may be analyzed using a high sensitivity GPC (Gel Permeation Chromatography).

Removing the high molecular weight particulates from the composition for forming a silica layer may be accomplished according to the following method. Thus, the composition for forming a silica layer (in which the high molecular weight particulates are substantially removed) may have a number of in-liquid particulates of 0 to about 100/cc in the solution state. For example, a number of in-liquid particulates per cubic centimeter of the composition may be 0 to about 100.

The high molecular weight (e.g., in-liquid) particulates may include, e.g., hydrogenated polysilazane, hydrogenated polysiloxazane, or a combination thereof having a weight average molecular weight, reduced to polystyrene, of greater than or equal to about 50,000. For example, the high molecular weight particulates may include hydrogenated polysilazane, hydrogenated polysiloxazane, or a combination thereof having a weight average molecular weight, reduced to polystyrene, of about 50,000 to about 5,000,000.

The high molecular weight particulates (including, e.g., the high molecular weight hydrogenated polysilazane, hydrogenated polysiloxazane, or combination thereof) may be present in the composition in a concentration of 0 wt % to about 0.1 wt %, e.g., in a concentration of 0 wt % to about 0.07 wt %, or in a concentration of 0 wt % to about 0.05 wt %, based on a total amount of hydrogenated polysilazane and/or hydrogenated polysiloxazane in the composition, in view of defects. For example, within the range, a silica layer prepared from the composition may have reduced defects and may be effectively used in a device requiring high quality electric characteristics, e.g., a semiconductor, a liquid crystal, or the like. Therefore, it is desirable that the concentration of high molecular weight hydrogenated polysilazane and/or hydrogenated polysiloxazane particulates be controlled within the range.

The hydrogenated polysilazane or hydrogenated polysiloxazane may include a moiety represented by the following Chemical Formula 1.

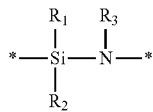

<Chemical Formula 1>

In Chemical Formula 1, $R_1$ to $R_3$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

The hydrogenated polysiloxazane may further include a moiety represented by the following Chemical Formula 2.

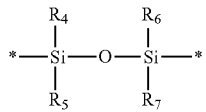

<Chemical Formula 2>

In Chemical Formula 2, $R_4$ to $R_7$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

The hydrogenated polysiloxazane may include a silicon-oxygen-silicon (Si—O—Si) bond in addition to a silicon-nitrogen (Si—N) bond in the structure thereof. This silicon-oxygen-silicon (Si—O—Si) bond may help relieve stress during curing through heat treatment and thus, may help decrease contraction.

An oxygen content in the hydrogenated polysiloxazane may be about 0.2 to about 3 wt %, in the view of suppressing the structure contraction during a heating (thermal) process. When included within the range, stress may be sufficiently relaxed by a silicon-oxygen-silicon (Si—O—Si) bond in the structure to thereby help prevent contraction during the heating treatment so that the generation of cracks may be prevented in the obtained silica layer or charge pattern. In an implementation, the oxygen content may be about 0.4 to about 2 wt %.

The hydrogenated polysiloxazane may include a moiety represented by the following Chemical Formula 3 at a terminal end thereof.

 [Chemical Formula 3]

The moiety represented by the above Chemical Formula 3 may form a terminal end capped with hydrogen and may be included in an amount of about 15 wt % to about 35 wt %, based on a total amount of Si—H bonds in the hydrogenated polysiloxazane. Within the range, an oxidation reaction during the heat treatment may occur at a sufficient rate and also, scattering of $SiH_3$ into $SiH_4$ may be reduced and/or prevented. Accordingly, the Si—H bond may help prevent contraction and thus, may help prevent a crack on the silica layer or charge pattern.

In an implementation, the weight average molecular weight of the hydrogenated polysilazane and/or hydrogenated polysiloxazane may be about 1,000 to about 10,000, in view of solubility in an organic solvent and/or coating characteristics on a substrate.

The hydrogenated polysilazane and/or the hydrogenated polysiloxazane may be included in the composition in an amount of about 0.1 to about 50 wt %, based on a total weight of the composition for forming a silica layer. When included within this range, an appropriate viscosity may be maintained. In addition, when the composition for forming a silica layer (including the hydrogenated polysilazane and/or the hydrogenated polysiloxazane) fills a gap, the silica layer may be formed smooth and uniform without voids.

The composition for forming a silica layer may further include a thermal acid generator (TAG). The thermal acid generator is an additive that may help improve developing properties of the hydrogenated polysilazane and/or the hydrogenated polysiloxazane. The hydrogenated polysilazane and/or the hydrogenated polysiloxazane may be developed at a relatively low temperature.

The thermal acid generator may include any suitable compound that generates acid ($H^+$) in response to heat. For example, the thermal acid generator may include a compound activated at about 90° C. or higher and generating sufficient acid while also having low volatility. The thermal acid generator may include, e.g., nitrobenzyl tosylate, nitrobenzyl benzenesulfonate, phenol sulfonate, or a combination thereof.

The thermal acid generator may be included in the composition in an amount of about 0.01 to about 25 wt %, based on the total weight of the composition for forming a silica layer. Within this range, the hydrogenated polysiloxazane may be developed at a low temperature while also having improved coating properties.

The composition for forming silica layer may further include a surfactant. The surfactant may include, e.g., a non-ion-based surfactant of polyoxyethylene alkyl ethers such as polyoxyethylene lauryl ether, polyoxyethylene stearyl ether, polyoxyethylene cetyl ether, polyoxyethylene oleyl ether, or the like; polyoxyethylene alkylallyl ethers such as polyoxyethylene nonylphenolether, or the like; polyoxyethylene.polyoxypropylene block copolymers; polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, or the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), or the like; other silicone-based surfactant such as a organosiloxane polymer KP341 (Shin-Etsu Chemical Co., Ltd.), or the like.

The surfactant may be included in the composition in an amount of about 0.001 wt % to about 10 wt %, based on the total weight of the composition for forming silica layer.

Within this range, dispersion of a solution as well as uniform thickness of a layer and filling properties may be improved.

The composition for forming a silica layer may be a solution in which the hydrogenated polysilazane and/or the hydrogenated polysiloxazane and the other components are dissolved in a solvent.

The solvent may include any suitable solvent that is capable of dissolving the components. In an implementation, the solvent may include, e.g., aromatic hydrocarbons (such as xylene or the like) or ethers (such as dibutyl ether or the like).

The solvent may be included as a balance, e.g., other than the aforementioned components, based on the total amount of the composition for forming a silica layer.

The method of preparing the composition for forming a silica layer including hydrogenated polysilazane and/or hydrogenated polysiloxazane (in which the high molecular weight particulates are removed) may include: mixing a halosilane compound with a solvent and performing a co-ammonolysis to synthesize a hydrogenated polysilazane or a hydrogenated polysiloxazane, thus forming a resultant solution including the hydrogenated polysilazane or the hydrogenated polysiloxazane; adding an additional solvent of a C4 to C10 alkane, a C4 to C10 cycloalkane, a C4 to C10 alkene, a C4 to C10 cycloalkene, decalin, tetralin, p-cymene, p-menthane, α-pinene, or a combination thereof to precipitate an insoluble precipitate; and removing the precipitated insoluble precipitate.

The composition for forming a silica layer a solution prepared by the method may have the high molecular weight hydrogenated polysilazane and/or the hydrogenated polysiloxazane removed, so an in-liquid particulate number in the composition for forming a silica layer a solution may be about 0 to about 100/cc.

The additional, later-added solvent in the composition for forming a silica layer may be used to precipitate the high molecular weight hydrogenated polysilazane and/or hydrogenated polysiloxazane and may be later removed by, e.g., evaporation, when it is unfavorable for forming a silica layer.

The additional solvent may include, e.g., n-octane, cyclohexane, n-hexane, p-menthane, α-pinene, n-pentane, n-heptane, or a combination thereof.

As noted above, the additional solvent may selectively precipitate high molecular weight hydrogenated polysilazane and/or hydrogenated polysiloxazane. Thus, the high molecular weight particulate may be removed by filtering using, e.g., a filter. When the high molecular particulate is removed, occurrence of defects in a silica layer prepared from the composition may be reduced.

The molecular weight range of the high molecular hydrogenated polysilazane and/or hydrogenated polysiloxazane (to be precipitated for separation), may be controlled by changing the amount of the additional solvent added. For example, a weight ratio of the solvent included in the solution (before adding to the additional solvent) to the additional solvent may be about 1:1 to about 1:30. In an implementation, the mixing ratio may be about 1:5, about 1:6, about 1:8, about 1:9, about 1:10, about 1:15, or the like. In this case, by increasing the amount of additional solvent, the precipitated amount of high molecular hydrogenated polysilazane and/or hydrogenated polysiloxazane may be increased, and the weight average molecular weight of hydrogenated polysilazane and/or hydrogenated polysiloxazane (remaining in solution) may be decreased.

In order to remove the precipitated insoluble particulate having a certain size or greater, a pore size of filter may be controlled. For example, the particulate having a size greater than the pore size of filter may be filtered and removed using a filter having a pore size of about 0.01 μm to about 0.2 μm.

The silica layer having reduced defects may be manufactured by using the composition for forming a silica layer according to an embodiment. The obtained silica layer may have a number of defects (having a size of less than or equal to about 5 μm) of less than or equal to about 1,000/8-inch wafer. In other words, the silica layer may have a number of defects (having a size of less than or equal to about 5 μm) of less than or equal to about 1,000 per 8-inch wafer, e.g., about 19.88 per square inch.

The silica layer is not particularly limited, and may be fabricated by any suitable method.

For example, the silica layer may be formed by coating a device substrate (e.g., a semiconductor and/or liquid crystal) with the composition for forming silica layer according to an embodiment, drying the substrate, and curing the composition. Curing the composition may include heating the dried coated substrate in a water vapor-containing atmosphere at a temperature of about 200° C. or higher.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLE

Each polysilazane solution or polysiloxazane solution obtained from the following Examples 1 to 5 and Comparative Examples 1 to 5 was measured for the number of in-liquid particulates, the oxygen content, the weight average molecular weight, and the high molecular weight components, and the results are shown in the following Table 1. The measuring devices used were as follows:

In-liquid particulate: manufactured by Rion; in liquid particle sensor•counter KS-42BF Oxygen content: manufactured by Thermo Fisher Scientific Inc; FlashEA 1112

Weight average molecular weight and high molecular component:

GPC manufactured by Waters; HPLC Pump 1515, RI Detector 2414 and column manufactured by Shodex; KF801, 802, 803

Example 1

Preparation of Hydrogenated Polysilazane Solution

An interior of a reactor (having a capacity of 2 L and mounted with an agitator and a temperature controller) was purged with dry nitrogen. 1,500 g of dry pyridine was injected into the reactor and the temperature was maintained at 5° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. An obtained white slurry product was filtered by a 1 μm TEFLON (tetrafluoroethylene) filter under the dry nitrogen atmosphere to provide a 1,000 g of filtrate. 1,000 g of dry xylene was added thereto, and then the solid concentration was adjusted to 20 wt % while repeating the substitution of pyridine with xylene in the solvent using a rotary evaporator a total of 3 times and filtered by a TEFLON (tetrafluoroethylene) filter having a pore size of 0.1 μm to provide a hydrogenated polysilazane solution.

Precipitation of Insoluble Precipitate

An interior of a reactor (having a capacity of 1 L and mounted with an agitator) was purged with dry nitrogen. 100 g of the intermediate hydrogenated polysilazane solution was injected into the reactor, and 800 g of dry n-octane was slowly injected into the reactor for 30 minutes while agitating at room temperature. The agitation was stopped and the reactor was maintained for 3 hours. The resultant solution was filtered with a TEFLON (tetrafluoroethylene) filter having a pore size of 0.1 μm. The solid concentration was adjusted to 20 wt % while repeating an operation of removing n-octane using a rotary evaporator and substituting with xylene a total of 3 times, and the resultant solution was filtered by a TEFLON (tetrafluoroethylene) filter having a pore size of 0.02 μm. The obtained hydrogenated polysilazane solution had a weight average molecular weight, reduced to polystyrene, of about 1,700, and a peak in a high molecular region of greater than or equal to 50,000, corresponding to a concentration of about 0.02 wt %, was observed. The number of in-liquid particulates having a size of 0.2 μm or greater was about 5.2/cc in the solution.

Example 2

An interior of a reactor (having a capacity of 1 L and mounted with an agitator) was purged with dry nitrogen. 100 g of the hydrogenated polysilazane solution obtained from Example 1 was injected into the reactor and 600 g of dry cyclohexane was slowly injected into the reactor for 30 minutes while agitating at room temperature. The agitation was stopped and the reactor was maintained for 3 hours. The resultant solution was filtered with a TEFLON (tetrafluoroethylene) filter having a pore size of 0.1 μm. An operation of removing cyclohexane using a rotary evaporator and substituting with xylene was repeated three times to adjust the solid concentration to 20 wt %, and the resultant solution was filtered with a TEFLON (tetrafluoroethylene) filter having a pore size of 0.02 μm. The obtained hydrogenated polysilazane solution had a weight average molecular weight, reduced to polystyrene, of about 1,700, and a peak in a high molecular region of 50,000 or greater, corresponding to a concentration of about 0.02 wt %, was observed. The number of in-liquid particulates having a size of greater than or equal to 0.2 μm was about 3.8/cc in the solution.

Example 3

Preparation of Hydrogenated Polysilazane Solution

An interior of a reactor (having a capacity of 2 L and mounted with an agitator and a temperature controller) was purged with dry nitrogen. 1,500 g of dry pyridine was injected into the reactor, and a temperature thereof was maintained at 5° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. The obtained white slurry product was filtered by a 1 μm TEFLON (tetrafluoroethylene) filter under the dry nitrogen atmosphere to provide 1,000 g of filtrate. 1,000 g of dry xylene was added thereto, and then an operation of substituting pyridine with xylene in the solvent using a rotary evaporator was repeated a total of 3 times to adjust the solid concentration to 20 wt %, and the resultant solution was filtered by a TEFLON (tetrafluoroethylene) filter having a pore size of 0.1 μm.

The obtained hydrogenated polysilazane solution was maintained at 40° C. for 240 hours while agitating. Then, a precipitate of ammonium chloride (which provided cloudiness in the solution) was filtered by a TEFLON (tetrafluoroethylene) filter having a pore size of 0.02 μm.

Precipitation of Insoluble Precipitate

An interior of a reactor (having a capacity of 1 L and mounted with an agitator) was purged with dry nitrogen. 100 g of the obtained hydrogenated polysilazane solution was injected into the reactor, and 700 g of dry n-hexane was slowly injected into the reactor for 30 minutes while agitating at room temperature. The agitation was stopped, and the reactor was maintained for 3 hours. The resultant solution was filtered with a TEFLON (tetrafluoroethylene) filter having a pore size of 0.1 μM. An operation of removing n-hexane using a rotary evaporator and substituting with xylene was repeated three times to adjust the solid concentration to 20 wt %, and the resultant solution was filtered with a TEFLON (tetrafluoroethylene) filter having a pore size of 0.02 μm. The obtained hydrogenated polysilazane solution had a weight average molecular weight, reduced to polystyrene, of about 2,100, and a peak in high molecular region of greater than or equal to 50,000, corresponding to a concentration of about 0.02 wt %, was observed. A number of in-liquid particulates having a size of greater than or equal to 0.2 μm was about 3.2/cc in the solution.

Example 4

Preparation of Hydrogenated Polysiloxazane Solution

An interior of a reactor (having a capacity of 2 L and mounted with an agitator and a temperature controller) was purged with dry nitrogen. 1,500 g of dry pyridine was sufficiently mixed with 0.6 g of pure water and then introduced into the reactor, and the temperature was maintained at 20° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. The obtained white slurry product was filtered by a 1 μm TEFLON (tetrafluoroethylene) filter under the dry nitrogen atmosphere to provide 1,000 g of filtrate. 1,000 g of dry xylene was added thereto, and then an operation of substituting pyridine with dibutyl ether in the solvent using a rotary evaporator was repeated a total of 3 times to adjust the solid concentration to 20 wt %, and the resultant solution was filtered by a TEFLON (tetrafluoroethylene) filter having a pore size of 0.1 μm. The obtained hydrogenated polysiloxazane solution had an oxygen content of 0.2 wt % and a weight average molecular weight of 4,300, and a peak in a high molecular weight region of greater than or equal to 50,000 (indicating the presence of high molecular weight particulates) was observed.

The obtained hydrogenated polysiloxazane solution was introduced into a stainless canister having a capacity of 5 L, and an interior thereof was sufficiently purged with dry nitrogen and pressurized at 1 kg/cm$^2$G. The solution was aged in a freezer at −10° C. for 10 hours or more and filtered by a TEFLON (tetrafluoroethylene) filter having a pore size of 0.02 μm. The hydrogenated polysiloxazane solution had a weight average molecular weight of 4,400, and a peak in a high molecular region of greater than or equal to 50,000 (indicating the presence of high molecular weight particulates) was observed.

Precipitation of Insoluble Precipitate

An interior of a reactor (having a capacity of 1 L and mounted with an agitator) was purged with dry nitrogen. 100 g of the obtained hydrogenated polysiloxazane solution was injected into the reactor, and 1,000 g of dry p-menthane was slowly injected into the reactor for 30 minutes while agitating at room temperature. The agitation was stopped and the reactor was maintained for 3 hours. The resultant solution was filtered with a TEFLON (tetrafluoroethylene) filter having a pore size of 0.1 μm. An operation of removing p-menthane using a rotary evaporator and substituting with xylene was repeated a total of three times to adjust the solid concentration to 20 wt %, and the resultant solution was filtered with a TEFLON (tetrafluoroethylene) filter having a pore size of 0.02 μm. The obtained hydrogenated polysiloxazane solution had a weight average molecular weight, reduced to polystyrene, of 4,200, and a peak in high molecular region of greater than or equal to 50,000, corresponding to a concentration of about 0.04 wt %, was observed. The number of in-liquid particulates having a size of greater than or equal to 0.2 μm was about 2.1/cc in the solution.

Example 5

Preparation of Hydrogenated Polysiloxazane Solution

An interior of a reactor (having a capacity of 2 L and mounted with an agitator and a temperature controller) was purged with dry nitrogen. 1,500 g of dry pyridine was sufficiently mixed with 0.6 g of pure water and then introduced into the reactor, and the temperature was maintained at 20° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. The obtained white slurry product was filtered by a 1 μm TEFLON (tetrafluoroethylene) filter under the dry nitrogen atmosphere to provide 1,000 g of filtrate. 1,000 g of dry xylene was added thereto, and then an operation of substituting pyridine with dibutyl ether in the solvent using a rotary evaporator was repeated a total of 3 times to adjust the solid concentration to 20 wt %, and the resultant solution was filtered by a TEFLON (tetrafluoroethylene) filter having a pore size of 0.1 μm. The obtained hydrogenated polysiloxazane solution had an oxygen content of 0.2 wt % and a weight average molecular weight of 4,300, and a peak in a high molecular region of greater than or equal to 50,000 (indicating the presence of high molecular weight particulates) was observed.

The obtained hydrogenated polysiloxazane solution was introduced into a 5 L stainless canister, and an interior thereof was sufficiently purged with dry nitrogen and pressurized at 1 kg/cm²G. The solution was aged in a freezer at −10° C. for 10 hours and filtered with a TEFLON (tetrafluoroethylene) filter having a pore size of 0.02 μm. The hydrogenated polysiloxazane solution had a weight average molecular weight of 4,400, and a peak in a high molecular region of greater than or equal to 50,000 (indicating the presence of high molecular weight particulates) was observed.

Precipitation of Insoluble Precipitate

An interior of a reactor having a capacity of 1 L and mounted with an agitator was purged with dry nitrogen. 100 g of the obtained hydrogenated polysiloxazane solution was injected into the reactor, and 900 g of dry α-pinene was slowly injected into the reactor for 30 minutes while agitating at room temperature. The agitation was stopped and the reactor was maintained for 3 hours. The resultant solution was filtered with a TEFLON (tetrafluoroethylene) filter having a pore size of 0.1 μm. An operation of removing α-pinene using a rotary evaporator and substituting with xylene was repeated a total of three times to adjust the solid concentration to 20 wt %, and the resultant solution was filtered with a TEFLON (tetrafluoroethylene) filter having a pore size of 0.02 μm. The obtained hydrogenated polysiloxazane solution had a weight average molecular weight, reduced to polystyrene, of 4,500, and a peak in high molecular region of greater than or equal to 50,000, corresponding to a concentration of about 0.04 wt %, was observed. The number of in-liquid particulates having a size of greater than or equal to 0.2 μm was about 4.1/cc in the solution.

Comparative Example 1

An interior of a reactor (having a capacity of 2 L and mounted with an agitator and a temperature controller) was purged with dry nitrogen. 1,500 g of dry pyridine was injected into the reactor, and the temperature was maintained at 5° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. The obtained white slurry product was filtered by a 1 μm TEFLON (tetrafluoroethylene) filter under the dry nitrogen atmosphere to provide 1,000 g of filtrate.

1,000 g of dry xylene was added thereto, and then an operation of substituting pyridine with xylene in the solvent using a rotary evaporator was repeated a total of 3 times to adjust the solid concentration to 20 wt %, and the resultant solution was filtered by a TEFLON (tetrafluoroethylene) filter having a pore size of 0.1 μm. The obtained hydrogenated polysilazane solution had a weight average molecular weight, reduced to polystyrene, of 1,600, and a peak in high molecular region of greater than or equal to 50,000, corresponding to a concentration of about 0.21 wt %, was observed. The number of in-liquid particulates having a size of greater than or equal to 0.2 μm was about 1,220/cc in the solution.

Comparative Example 2

The hydrogenated polysilazane solution obtained from Comparative Example 1 was maintained at 40° C. for 240 hours while agitating under the conditions described in Example 1 and filtered with a TEFLON (tetrafluoroethylene) filter having a pore size of 0.1 μm. The obtained hydrogenated polysilazane solution had a weight average molecular weight, reduced to polystyrene, of 1,800, and a peak in high molecular region of greater than or equal 50,000, corresponding to a concentration of about 0.28 wt %, was observed. The number of in-liquid particulates having a size of greater than or equal to 0.2 μm was about 1,460/cc in the solution.

Comparative Example 3

The hydrogenated polysilazane solution obtained from Comparative Example 1 was filtered with a TEFLON (tetrafluoroethylene) filter having a pore size of 0.02 μm. The obtained hydrogenated polysilazane solution had a weight average molecular weight, reduced to polystyrene, of 1,800, and a peak in high molecular region of greater than or equal to 50,000, corresponding to a concentration of about 0.13 wt %, was observed. The number of in-liquid particulates having a size of greater than or equal to 0.2 μm was about 960/cc in the solution.

Comparative Example 4

An interior of a reactor (having a capacitor of 2 L and mounted with agitator and a temperature controller) was purged with dry nitrogen. 1,500 g of dry pyridine was sufficiently mixed with 2.0 g of pure water and introduced into the reactor, and the temperature was maintained at 5° C. 100 g of dichlorosilane was slowly injected into the reactor for 1 hour. 70 g of ammonia was slowly injected into the reactor for 3 hours while agitating. Then, dry nitrogen was injected into the reactor for 30 minutes, and ammonia remaining in the reactor was removed. The obtained white slurry product was filtered by a 1 μm TEFLON (tetrafluoroethylene) filter under the dry nitrogen atmosphere to provide 1,000 g of filtrate. 1,000 g of dry xylene was added thereto, and then an operation of substituting pyridine with dibutyl ether in the solvent using a rotary evaporator was repeated a total of 3 times to adjust the solid concentration to 20 wt %, and the resultant solution was filtered by a TEFLON (tetrafluoroethylene) filter having a pore size of 0.1 μm. The obtained hydrogenated polysiloxazane solution had an oxygen content of 0.5 wt % and a weight average molecular weight, reduced to polystyrene, of about 2,200, and a peak in high molecular region of greater than or equal to 50,000, corresponding to a concentration of about 0.35 wt %, was observed. The oxygen content was about 3.5 ppm. The number of in-liquid particulates having a size of greater than or equal to 0.2 μm was about 690/cc in the solution.

Comparative Example 5

The hydrogenated polysilazane solution obtained from Comparative Example 1 was maintained at 40° C. for 240 hours while agitating. Then, an ammonium chloride precipitate (which formed cloudiness in the solution) was filtered by a TEFLON (tetrafluoroethylene) filter having a pore size of 0.02 μm. The hydrogenated polysiloxazane solution had a weight average molecular weight of 2,200, and the peak in high molecular region of greater than or equal to 50,000, corresponding to a concentration of about 0.25 wt %, was observed. The number of in-liquid particulates having a size of greater than or equal to 0.2 μm was about 740/cc in the solution.

TABLE 1

|  | Weight average molecular weight | Concentration of high molecular weight particulates of greater than or equal to 50,000 | Number of particles in solution (number/cc) |
| --- | --- | --- | --- |
| Comparative Example 1 | 1,600 | 0.21 wt % | 1,220 |
| Comparative Example 2 | 1,800 | 0.28 wt % | 1,460 |
| Comparative Example 3 | 1,800 | 0.13 wt % | 960 |
| Example 1 | 1,700 | 0.02 wt % | 5.2 |
| Example 2 | 1,700 | 0.02 wt % | 3.8 |
| Comparative Example 4 | 2,200 | 0.35 wt % | 690 |
| Comparative Example 5 | 2,200 | 0.25 wt % | 740 |
| Example 3 | 2,100 | 0.02 wt % | 3.2 |
| Example 4 | 4,200 | 0.04 wt % | 2.1 |
| Example 5 | 4,500 | 0.04 wt % | 4.1 |

FIG. 1 illustrates a graph showing the results when polysilazane and polysiloxazane solutions were measured using high sensitivity GPC (Gel Permeation Chromatography). The solid line indicates the results of the polysiloxazane solution obtained from Comparative Example 4, and the dotted line indicates the results of the polysilazane solution obtained from Example 3. It may be seen that the peak showing a weight average molecular weight, reduced to polystyrene, of greater than or equal to about 50,000 disappeared in Example 3.

From the results shown in Table 1, it may be seen that high molecular components or particulates (of greater than or equal to about 50,000) were substantially removed in Examples 1 to 5. For example, the high molecular components were not removed in Comparative Example 2; on the other hand, the high molecular components were removed in Example 1 and the insoluble material was precipitated using n-octane. In addition, Example 2 decreased the high molecular components from the hydrogenated polysilazane obtained by the same way as in Comparative Example 1 by precipitating the insoluble materials using cyclohexane. In Examples 3 to 5, the high molecular components were effectively removed from the polysiloxazane solution by precipitating the insoluble materials using n-hexane, p-menthane, and α-pinene, respectively.

By way of summation and review, as a size of a semiconductor chip is reduced, the size of the capacitor therein may also be reduced. The smaller capacitor may need sufficient storage capacity. The capacitor may achieve sufficient capacity by, e.g., increasing a vertical area instead of decreasing the horizontal area to increase overall active area. When a capacitor is formed in this way, a composition for forming a silica layer may be used to fill a mold and a gap thereon and effectively form an electrode that is relatively tall or high compared with a small horizontal area thereof.

The embodiments provide a composition for forming a silica layer, the composition including hydrogenated polysiloxazane and/or hydrogenated polysilazane and having reduced particulates.

The embodiments also provide a method of manufacturing a composition for forming a silica layer, the composition including hydrogenated polysiloxazane and/or hydrogenated polysilazane and having reduced particulates.

The embodiments also provide a silica layer having a small number of defects.

The embodiments also provide a method of manufacturing a silica layer having a small number of defects.

When the silica layer is formed using the composition for forming a silica layer according to an embodiment, the occurrence of defects may be remarkably reduced, so as to improve insulation and gap fill characteristics of the silica layer.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A composition for forming a silica layer, the composition comprising:
   hydrogenated polysilazane, hydrogenated polysiloxazane, or a combination thereof,
   wherein a concentration of a sum of hydrogenated polysilazane and hydrogenated polysiloxazane having a weight average molecular weight, reduced to polystyrene, of greater than or equal to about 50,000 is about 0.1 wt % or less, based on a total amount of the hydrogenated polysilazane and hydrogenated polysiloxazane, wherein the composition has a number of in-liquid particulates, having a size of about 0.2 μm or greater, of about 100 or less per cc of solution, and wherein the hydrogenated polysilazane or the hydrogenated polysiloxazane has a weight average molecular weight of about 1,000 to about 10,000.

2. The composition for forming a silica layer as claimed in claim 1, wherein the concentration of the sum of hydrogenated polysilazane and hydrogenated polysiloxazane having a weight average molecular weight, reduced to polystyrene, of greater than or equal to about 50,000 is about 0.05 wt % or less, based on the total amount of the hydrogenated polysilazane and hydrogenated polysiloxazane.

3. The composition for forming a silica layer as claimed in claim 1, wherein:

the hydrogenated polysilazane or the hydrogenated polysiloxazane includes a moiety represented by the following Chemical Formula 1:

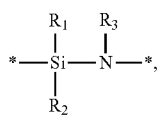
<Chemical Formula 1> and in Chemical Formula 1, $R_1$ to $R_3$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

4. The composition for forming a silica layer as claimed in claim 3, wherein:

the composition includes hydrogenated polysiloxazane that includes a moiety represented by the following Chemical Formula 2:

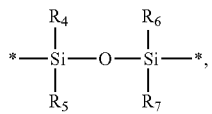
<Chemical Formula 2> and in Chemical Formula 2, $R_4$ to $R_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

5. The composition for forming a silica layer as claimed in claim 4, wherein:

the hydrogenated polysiloxazane further includes a moiety represented by the following Chemical Formula 3 at a terminal end thereof:

<Chemical Formula 3> the hydrogenated polysiloxazane has an oxygen content of about 0.2 wt % to about 3 wt %, and the moiety represented by Chemical Formula 3 is present in the hydrogenated polysiloxazane in an amount of about 15 wt % to about 35 wt %, based on a total amount of Si—H bonds in the hydrogenated polysiloxazane.

6. The composition for forming a silica layer as claimed in claim 1, wherein the hydrogenated polysilazane or the hydrogenated polysiloxazane is present in the composition in an amount of about 0.1 wt % to about 50 wt %, based on a total weight of the composition.

7. A method of manufacturing the composition as claimed in claim 1, the method comprising:

mixing a halosilane compound with a solvent, co-ammonolyzing the halosilane in the solvent to synthesize a hydrogenated polysilazane or a hydrogenated polysiloxazane to form a resultant solution including the hydrogenated polysilazane or the hydrogenated polysiloxazane;

precipitating an insoluble precipitate by adding an additional solvent to the resultant solution, the additional solvent including a C4 to C10 alkane, a C4 to C10 cycloalkane, a C4 to C10 alkene, a C4 to C10 cycloalkene, decalin, tetralin, p-cymene, p-menthane, α-pinene, or a combination thereof; and removing the precipitated insoluble precipitate.

8. The method as claimed in claim 7, wherein a weight ratio of the solvent included in the solution before adding the additional solvent to the additional solvent is about 1:1 to about 1:30.

9. The method as claimed in claim 7, further comprising removing the additional solvent after removing the precipitated insoluble precipitate.

10. The method as claimed in claim 7, wherein removing the precipitated insoluble precipitate includes filtering and removing the precipitated insoluble precipitate with a filter having a pore size of about 0.01 to about 0.2 μm.

11. A silica layer manufactured by curing the composition for forming a silica layer as claimed in claim 1, the silica layer including a number of defects having a size of less than or equal to about 5 μm of about 1,000 or less per 8-inch wafer.

12. A method of manufacturing a silica layer having reduced defects, the method comprising:

coating the composition for forming a silica layer as claimed in claim 1 on a substrate;

drying the substrate coated with the composition for forming a silica layer; and curing the composition in a water vapor-containing atmosphere at a temperature of about 200° C. or higher.

13. A composition for forming a silica layer, the composition comprising:

hydrogenated polysilazane, hydrogenated polysiloxazane, or a combination thereof, wherein:

a concentration of a sum of hydrogenated polysilazane and hydrogenated polysiloxazane having a weight average molecular weight, reduced to polystyrene, of greater than or equal to about 50,000 is about 0.1 wt % or less, based on a total amount of the hydrogenated polysilazane and hydrogenated polysiloxazane, the composition has a number of in-liquid particulates, having a size of about 0.2 μm or greater, of about 100 or less per cc of solution, the hydrogenated polysilazane or the hydrogenated polysiloxazane includes a moiety represented by the following Chemical Formula 1:

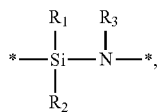
<Chemical Formula 1> and in Chemical Formula 1, $R_1$ to $R_3$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof, the composition includes hydrogenated polysiloxazane that includes a moiety represented by the following Chemical Formula 2:

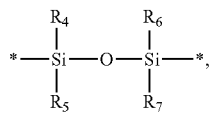
<Chemical Formula 2> and in Chemical Formula 2, $R_4$ to $R_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof, and the hydrogenated polysiloxazane further includes a moiety represented by the following Chemical Formula 3 at a terminal end thereof:

   <Chemical Formula 3> the hydrogenated polysiloxazane has an oxygen content of about 0.2 wt % to about 3 wt %, and the moiety represented by Chemical Formula 3 is present in the hydrogenated polysiloxazane in an amount of about 15 wt % to about 35 wt %, based on a total amount of Si—H bonds in the hydrogenated polysiloxazane.

\* \* \* \* \*